United States Patent
Ohsato et al.

(10) Patent No.: US 7,049,258 B2
(45) Date of Patent: May 23, 2006

(54) MICROWAVE DIELECTRIC COMPOSITE COMPOSITION

(75) Inventors: Hitoshi Ohsato, Hirahari-Jutaka 13-28, 2845-Banchi 272 Aza-Kuroishi, Oaza-Hirahari, Tenpaku-cho, Tenpaku-ku, Nagoya-city, Aichi (JP) 468-0021; Akio Harada, Osaka (JP); Takashi Okawa, Osaka (JP); Hiroki Okabe, Osaka (JP)

(73) Assignees: Hitoshi Ohsato, Aichi (JP); Daiken Chemical Co., Ltd., Osaka (JP)

( * ) Notice: Subject to any disclaimer, the term of this patent is extended or adjusted under 35 U.S.C. 154(b) by 84 days.

(21) Appl. No.: 10/486,066

(22) PCT Filed: Jul. 4, 2002

(86) PCT No.: PCT/JP02/06823

§ 371 (c)(1),
(2), (4) Date: Feb. 6, 2004

(87) PCT Pub. No.: WO03/016237

PCT Pub. Date: Feb. 27, 2003

(65) Prior Publication Data

US 2004/0242403 A1 Dec. 2, 2004

(30) Foreign Application Priority Data

Aug. 9, 2001 (JP) .............................. 2001-241708

(51) Int. Cl.
*C04B 35/468* (2006.01)
(52) U.S. Cl. ....................................................... 501/139
(58) Field of Classification Search ................. 501/139
See application file for complete search history.

(56) References Cited

U.S. PATENT DOCUMENTS 6,503,861 B1 * 1/2003 Murakawa et al. .......... 501/137
6,649,554 B1 * 11/2003 Chang et al. ................ 501/137

(Continued)

OTHER PUBLICATIONS

R. Bontchev et al., "New 5H hexagonal perovskite-like oxides (the series $ALa_4Ti_3RuO_{15}$, where A=Ca, Sr, Br)", *Materials Research Bulletin*, (1992), vol. 27, No. 8, pp 931-938.

(Continued)

*Primary Examiner*—Karl Group
(74) *Attorney, Agent, or Firm*—Koda & Androlia

(57) ABSTRACT

Various high quality microwave dielectric composite compositions are prepared by replacing a part of Ba, La or Ti with another element in a dielectric material represented by $Ba_nLa_4Ti_{3+n}O_{12+3n}$. A first embodiment thereof comprises a ceramic composition represented by $(Ba_{1-x}A_x)_nLa_4Ti_{3+n}O_{12+3n}$, wherein A is an alkaline earth metal element except Ba, and 0.5<n<5 and 0<x<0.5, which is a composite composition being homologous as the former dielectric material and having a chemical formula obtained by replacing a part of Ba with an alkaline earth metal element except Ba. Similarly, a part of La and a part of Ti can be replaced with a rare earth element except La and an element except Ti, respectively. The above various microwave dielectric composite compositions can be used for adjusting microwave dielectric characteristics of a material through replacing a part of a constituent element with another element and thus increasing the variety of the material for a dielectric resonator.

7 Claims, 2 Drawing Sheets

U.S. PATENT DOCUMENTS 6,905,994 B1 * 6/2005 Ohsato et al. ............... 501/136

OTHER PUBLICATIONS

S. Skapin et al., "Chemical reactions and dielectric properties of the $BaTiO_3$-$LaAIO_3$ and $BaTiO_3$-$LaAIO_3$-$LaTi_{3/4}O_3$ Systems", *Journal of Solid State Chemistry*, (1997), vol. 129, No. 2, pp 223-230.

ГЕРМАН М., К ПОВЪА Л.М., ГЕКСАГОНАЛЬНЫЕ <<П RPOBCK ИТНЫЕ>> фАЗЫ В СИСТЕМАХ $La_2O_2$—$TiO_2$- MO (M=Mg, Ca, Sr, Ba), (1983), vol. 28, No. 9, pp 2377-2379.

Hitoshi Ohsato et al., "Non-linear microwave quality factor change based on the site occupancy of cations on the tungstenbronze-type $Ba_{6-3x}R_{8+2x}Ti_{18}O_{54}$ (R-Rare Earth) solid solutions", *Ceramic Transactions* (1999), vol. 100 (Dielectric Ceramic Materials), pp 42-50.

Takashi Okawa et al., "Microwave dielectric properties of $Ba_nLa_4Ti_{3+n}O_{12+3n}$ homologous series", Japanese Journal of Applied Physics, Part1, Regular Papers, Short Notes & Review Papers (2001 nen, Sep.), vol. 40, No. 9B, pp 5779-5782.

* cited by examiner

MICROWAVE DIELECTRIC COMPOSITE COMPOSITION

BACKGROUND OF THE INVENTION

1. Field of the Invention

The present invention relates to a microwave dielectric composition used for dielectric resonator, dielectric substrate, dielectric antenna and so on, in the field of mobile radio communication such as cellular phone, and more specifically relates to the new microwave dielectric composition having the excellent properties of quality factor, dielectric constant and temperature coefficient.

2. Prior Art

Recent increment of communication information capacity promotes the use of high frequency band, and the communication by microwave of 3 GHz–30 GHz is developed by remarkable force. The representative is cellular phone, and through miniaturization of high quality circuit components, the cellular phone is miniaturized/weight saved/multifunctionized and it becomes very popular quickly.

Transmitter and wave filter are the circuit elements transmitting and receiving microwave signal, respectively and the important components of communication equipment. Since dielectric ceramics are used as the circuit element which is transmitting and receiving microwave by resonance of microwave, said circuit element is called a microwave dielectric resonator. Today, popularization of cellular phone is caused by the inexpensive high quality microwave dielectric resonator.

Next three kinds of property are required for the microwave dielectric resonator.

(1) Relative dielectric constant ($\in_r$) is large: when a wavelength of microwave in vacuum is $\lambda_0$, the wavelength $\lambda$ in said dielectric satisfies the equation $\lambda = \lambda_0 / \sqrt{\in_r}$.

Since the size of resonator becomes $1/\sqrt{\in_r}$, it is possible to miniaturize the resonator by using of the dielectric of large $\in_r$.

(2) Quality factor (Q·f: product of Q and f) is large: energy loss occurs when the microwave passes the dielectric, and this dielectric loss is expressed by tan δ. Since so called Q factor is given by Q=1/tan δ, the dielectric having small dielectric loss has large Q factor. This Q factor depends upon the resonance frequency f, and a relationship that the product of Q and f is constant, namely Q·f=const. is concluded. This Q·f is called quality factor, which is used in evaluation of dielectric loss because high quality dielectric has large value of Q·f.

(3) Temperature coefficient of resonance frequency ($\tau_f$) is almost zero: it is desirable that the temperature coefficient ($\tau_f$) of resonance frequency of a circuit system is zero or close to zero so that the resonance frequency does not vary with temperature.

Material development satisfying these conditions is going on, but the matter of fact is that the material development of dielectric possessing all three conditions is really difficult. Therefore, conventionally, materials having high dielectric constant value are used in 1 GHz zone such as cellular phone or personal handyphone system (PHS), and composite perovskite materials of large Q factor are used in 10 GHz zone such as down converter of satellite broadcast. In other words, it is the present situation that materials are used selectively according to frequency band.

The present inventors had studied zealously to develop a high quality microwave dielectric composition, and as a result, the inventors had conceived tungsten bronze type compositions mainly consisting of $BaO \cdot R_2O_3 \cdot 4TiO_2$. This microwave dielectric composition is expressed by $Ba_{6-3x}R_{8+2x}Ti_{18}O_{54}$ (R is a rare earth element, x satisfies a range of 0.5≦x≦0.7), and already published as Japanese Patent Open-Laid Publication No. 10-274005.

This tungsten bronze type composition is manufactured easily comparatively and suitable in the field of cellular phone requiring as mass production for a short term. However, so far as judging from three conditions of relative dielectric constant $\in_r$, quality factor Q·f and temperature coefficient $\tau_f$, the present is the developmental stage of implementation of microwave dielectric material with better quality.

In such situation, the present inventors discovered a series of compositions having excellent microwave dielectric properties in the vicinity of tungsten bronze type composition. It was found that the composition formula of this composition is expressed by $Ba_nLa_4Ti_{3+n}O_{12+3n}$ (n=1,2 or 4).

While a further study, the present inventors found that this composition had been already announced as "Microwave Dielectric Properties of Hexagonal Perovskites"(Materials Research Bulletin, Vol. 31(1996)pp. 431–437) by C. Vineis, P. K. Davies, T. Negas and S. Bell.

In this paper, C. Vineis et al. disclose the dielectric properties of composition expressed by composition formula of $BaLa_4Ti_4O_{15}$ and $Ba_2La_4Ti_5O_{18}$. These two compositions are understood as the cases of n=1 and 2 of said series of ceramic composition expressed by $Ba_nLa_4Ti_{3+n}O_{12+3n}$ which present inventors systematically discovered. A composition expressed by the general formula with n satisfying 1, 2 or 4 is called homologous composition.

As C. Vineis et al. published, this series of homologous composition is the microwave dielectric material, which satisfies these conditions of the relative dielectric constant $\in_r$, the quality factor Q·f and the temperature coefficient of resonance frequency $\tau_f$ whose the performance is applicable to microwave products such as cellular phone.

The homologous composition having excellent quality is requested by further development that is not limited to Ba—La—Ti system of the homologous composition expressed by $BanLa_4Ti_{3+n}O_{12+3n}$ (n=1,2,4) having excellent characteristic. However, at present, this composition is a pure state ceramic cmposition which is limited to the case of $Ba_nLa_4Ti_{3+n}O_{12+3n}$, and n is limited to integer number of 1, 2 or 4. In the case using only this kind of homologous composition, the range of material selection is narrow and limitation appears in quality improvement and diversification of products.

In addition, as described above, the strict manufacturing conditions relating to ingredient composition, component ratio and purity make degradation of microwave dielectric unit price difficult, and induce the price rise of microwave dielectric resonator. Therefore, the study to realize the reduction of manufacturing price of microwave dielectric becomes definitely necessary for the further spread of cellular phone and its excellent performance.

Therefore, the first object of the present invention is to develop the microwave dielectric composite composition having wide variety and excellent quality by adding other elements to Ba, La and Ti with keeping homologous structure expressed by $Ba_nLa_4Ti_{3+n}O_{12+3n}$. In addition, the second object of the present invention is to realize the microwave dielectric composite composition having high quality and low price by expanding the index n to vicinity of 1, 2 and 4.

SUMMARY OF THE INVENTION

The present invention is to realize said objects, and the first invention is a microwave dielectric composite composition characterized in that said microwave dielectric composite composition comprises a ceramic composition represented by $(Ba_{1-x}A_x)_nLa_4Ti_{3+n}O_{12+3n}$, wherein A is an alkaline earth metal element except for Ba, n satisfies a range of $0.5<n<5$ and x satisfies a range of $0<x<0.5$.

The second invention is a microwave dielectric composite composition characterized in that said microwave dielectric composite composition comprises a ceramic composition represented by $Ba_n(La_{1-y}R_y)_4Ti_{3+n}O_{12+3n}$, wherein R is Al or a rare earth element except for La, n satisfies a range of $0.5<n<5$ and y satisfies a range of $0<y<0.5$.

The third invention is a microwave dielectric composite composition characterized in that said microwave dielectric composite composition comprises a ceramic composition represented by $Ba_nLa_4(Ti_{1-z}M_z)_{3+n}O_{12+3n}$, wherein M is an additional element except for Ti, n satisfies a range of $0.5<n<5$ and z satisfies a range of $0<z<0.5$.

The fourth invention is a microwave dielectric composite composition characterized in that said microwave dielectric composite composition comprises a ceramic composition represented by $(Ba_{1-x}A_x)_n(La_{1-y}R_y)_4Ti_{3+n}O_{12+3n}$, wherein A is an alkaline earth metal element except for Ba, R is Al or a rare earth element except for La, n satisfies a range of $0.5<n<5$, x satisfies a range of $0<x<0.5$ and y satisfies a range of $0<y<0.5$.

The fifth invention is a microwave dielectric composite composition characterized in that said microwave dielectric composite composition comprises a ceramic composition represented by $(Ba_{1-x}A_x)_nLa_4(Ti_{1-z}M_z)_{3+n}O_{12+3n}$, wherein A is an alkaline earth metal element except for Ba, M is an additional element except for Ti, n satisfies a range of $0.5<n<5$, x satisfies a range of $0<x<0.5$ and z satisfies a range of $0<z<0.5$.

The sixth invention is a microwave dielectric composite composition characterized in that said microwave dielectric composite composition comprises a ceramic composition represented by $Ba_n(La_{1-y}R_y)_4(Ti_{1-z}M_z)_{3+n}O_{12+3n}$, wherein R is Al or a rare earth element except for La, M is an additional element except for Ti, n satisfies a range of $0.5<n<5$, y satisfies a range of $0<y<0.5$ and z satisfies a range of $0<z<0.5$.

The seventh invention is a microwave dielectric composite composition characterized in that said microwave dielectric composite composition comprises a ceramic composition represented by $(Ba_{1-x}A_x)_n(La_{1-y}R_y)_4(Ti_{1-z}M_z)_{3+n}O_{12+3n}$, wherein A is an alkaline earth metal element except for Ba, R is Al or a rare earth element except for La, M is an additional element except for Ti, n satisfies a range of $0.5<n<5$, x satisfies a range of $0<x<0.5$, y satisfies a range of $0<y<0.5$ and z satisfies a range of $0<z<0.5$.

In order to explain said invention, well-known homologous composition is explained at first. The composition expressed by $Ba_nLa_4Ti_{3+n}O_{12+3n}$ (n=1,2 or 4) is called homologous composition. The present inventors discovered said homologous composition in the vicinity of pseudo tungsten bronze type composition through the study of three-component system composition of $BaO \cdot La_2O_3 \cdot TiO_2$, and also discovered that said homologous composition has the excellent microwave dielectric properties.

FIG. 1 is a three-component diagram of $BaO \cdot La_2O_3 \cdot TiO_2$. Said homologous composition is located on a line to connect between $BaTiO_3$ and $La_4Ti_3O_{12}$, where $BaLa_4Ti_4O_{15}$ (n=1) exists at a position of 50 mol % of $La_4Ti_3O_{12}$, $Ba_2La_4Ti_5O_{18}$ (n=2) exists at a position of 33 mol % of $La_4Ti_3O_{12}$, and $Ba_4La_4Ti_7O_{24}$ (n=4) exists at a position of 20 mol % of $La_4Ti_3O_{12}$.

FIG. 2 shows a crystal structure diagram of homologous compositions in the cases of n=1 and 2. These crystal structures are the structure that oxygen hexagonal coordination octahedrons including $Ti^{4+}$ are arranged in particular positions together with $La^{3+}$ and $Ba^{2+}$. This structure can be regarded as layered perovskite structure.

Homologous is part structure, and it means that the part structure with small n is included in the part structure with large n. As seen in FIG. 2, the crystal structure of $BaLa_4Ti_4O_{15}$ of n=1 is included in the crystal structure of $Ba_2La_4Ti_5O_{18}$ of n=2. Although not shown in the diagram, it is found that the crystal structures of n=1 and 2 are included in the crystal structure of n=4.

Therefore, homologous structure (part structure) possesses a property to take the higher order systematically as n increases. As just described, the homologous composition is the composition of same element constitution whose higher order structure including the lower order structure. The fact that the excellent microwave dielectric property is contained in this homologous structure of Ba—La system was discovered by the present inventors and C. Vineis et al.

The present inventors have continued further study, and conceived that if excellent microwave dielectric property appears in this Ba—La system homologous structure, the homologous structure replaced a part of Ba with other alkaline earth metal element must reveal the same excellent microwave dielectric property, too.

Similarly, it is considered that the excellent microwave dielectric property must appear in the homologous structure in which a part of La is replaced with other rare earth element or a part of Ti is replaced with other element. That is to say, first part of the present invention is based on the idea that a ceramic composition with homologous structure must have excellent microwave dielectric property.

As the compositions having unchanged homologous structure, four other cases are included. In other words, on the assumption of part replacement of elements, there are three part-replacing cases of both of Ba and La, both of Ba and Ti, both of La and Ti, and the rest is the part-replacing case of three elements of Ba, La and Ti.

In other words, so far as n=1, 2, 4 is held, the homologous structure as the composition is preserved in the following seven cases based upon part replacement of Ba, La and Ti, namely there are cases that one of three is partially replaced, two of three are partially replaced, and all the three is partially replaced. In other words, the first object of the present invention is achieved by transforming well-known Ba—La—Ti system composition of which homologous structure is held immutably.

Next, the present inventors considered that not only the homologous structure limited to n=1,2 and 4 but also the homologous similar structure which positions around the three natural numbers have the excellent microwave dielectric properties. The homologous similar structure means the mixed system made up of plural homologous compositions such as coexisting composition of homologous structures with n=1 and 2, and also means the composition containing mainly n=1 or 2. In these cases, the mixed system of plural homologous compositions is good. In particular, it is considered that the microwave dielectric properties become good in the vicinity of compositional ratio of n=1,2 and 4. Therefore, the compositional ratio n is expanded into real number from integer.

For the compositional ratio n around n=1,2 and 4, the compositional ratio in the range of 0.5<n<5 is examined. As a result, it is confirmed that the microwave dielectric composition satisfying the above-described range can be used as the microwave transmitter receiver applicable to cellular phone and etc. Therefore, in the microwave dielectric composite composition described previously, the second object of the present invention is achieved by expanding the compositional ratio n into the real number range of 0.5<n<5. In the following, the present invention is explained by using of composition formula.

In the present invention, a part of Ba is replaced with other alkaline earth metal element and then $Ba_{1-x}A_x$ is prepared. In addition, a part of La is replaced with other rare earth elements or Al and then $La_{1-y}R_y$ is prepared, and furthermore, a part of Ti is replaced with other element M and then $Ti_{1-z}M_z$ is prepared. Therefore, in the present invention, conventional single element system is spread to dual element system. In this meaning, what we call conventional microwave dielectric composition is named as microwave dielectric composite composition in the present invention.

Furthermore, the present inventors considered that the excellent microwave dielectric properties are shown in the case that a part of La is replaced with not only other rare earth elements but also trivalent cation, especially Al. Because it is considered that Al is the same trivalent cation as rare earth element and can be easily replaced with rare earth elements.

However, Al is a trivalent cation element, and it is expected that the microwave dielectric properties are improved by replacing with other trivalent cation, too. In particular, comparing with the case of replacement with other trivalent cation, it was discovered that the temperature coefficient of resonance frequency is extremely improved by replacing with Al. This is to say, Al performs the action bringing the temperature coefficient to almost zero. This discovery made important contribution to the present invention of the microwave dielectric composite composition, even though it is not clear the reason why Al replacement makes improvement of temperature coefficient.

Summarizing the above description briefly, seven kinds of formula are proposed below as the composition formula of microwave dielectric composite composition that is provided by the present invention. From these composition formulae, it is interpreted that the composite compositions of the present invention are provided by the transformation of the basic Ba—La—Ti system composition.

(1) $(Ba_{1-x}A_x)_nLa_4Ti_{3+n}O_{12+3n}$
(2) $Ba_n(La_{1-y}R_y)_4Ti_{3+n}O_{12+3n}$
(3) $Ba_nLa_4(Ti_{1-z}M_z)_{3+n}O_{12+3n}$
(4) $(Ba_{1-x}A_x)_n(La_{1-y}R_y)_4Ti_{3+n}O_{12+3n}$
(5) $(Ba_{1-x}A_x)_nLa_4(Ti_{1-z}M_z)_{3+n}O_{12+3n}$
(6) $Ba_n(La_{1-y}R_y)_4(Ti_{1-z}M_z)_{3+n}O_{12+3n}$
(7) $(Ba_{1-x}A_x)_n(La_{1-y}R_y)_4(Ti_{1-z}M_z)_{3+n}O_{12+3n}$

As described before, the alkaline earth metal element A contains Mg, Ca, Sr or Ba, and the rare earth element R contains Sc, Y, lanthanoid, where lanthanoid contains La, Ce, Pr, Nd, Pm, Sm, Eu, Gd, Tb, Dy, Ho, Er, Tm, Yb, Lu. Furthermore, as the element, partially replaced with titanium, there is trivalent cation such as Zr, Si, Sn and so on, of course, this cation is not limited to them.

Previously described quantities of partial replacement (compositional ratio) x, y, and z are limited to 0<x<0.5, 0<y<0.5 and 0<z<0.5, respectively. That is to say, the replacement limit is arranged to 0.5, in view point that vice-element is added to the main element of Ba—La—Ti.

In these ranges, the compositional ratios x, y, z are decided so as to make the microwave dielectric properties good.

In the present invention, the compositional ratio n exists in the range of 0.5<n<5, and the homologous structure with n=1,2,4 is included with the other homologous similar structure which is existing aside from them. The homologous structure means the single homologous structure limited to n=1,2 or 4. The homologous similar structure in the range of 0.5<n<5 (excluding n=1, 2, 4) means a plural mixed system of homologous composition such as the coexisting, or the composition containing mainly the homologous composition with n=1,2 or 4.

Shape and dimension of microwave dielectric composition of the present invention are not especially limited and can be appropriately arranged according to end-product. For example, film-shape, seat-shape, rod-shape, pellet-shape, and other shape can be used arbitrarily. The usage thereof is similar to the method using well-known microwave dielectric.

Main materials are $BaCO_3$ (or BaO), $La^2O_3$, and $TiO_2$. As auxiliary material for replacement, the required quantity of $ACO_3$ (or AO), $R_2O_3$, (including $Al_2O_3$), $MO_2$ are added. The required quantity means the value giving the required compositional ratio n and the compositional ratio x, y and z. Here, A is alkaline earth metal element, R is rare earth element, or Al and M is other additional element.

$ACO_3$ represents $MgCO_3$, $CaCO_3$, $SrCO_3$ and $BaCO_3$. In the materials, for example, $BaCO_3$ is deaerated at the stage of pre-sintering and it becomes BaO. Since other $ACO_3$ has similar property, AO can be used from the beginning as the raw material.

In addition, $R_2O_3$ is rare earth oxide and represents $La_2O_3$, $Nd_2O_3$, $Sm_2O_3$, $Eu_2O_3$, $Gd_2O_3$, $Al_2O_3$ and so on. Since $R_2O_3$ is easy to be carbonated, and $La_2O_3$ is easy to be carbonated particularly, it is dried by pre-sintering in a Kanthal furnace at 1000° C. for 10 hours.

The objective composition is produced by mixing three material powders, forming any shape from the mixed powder and sintering the compact. The well-known powder preparation method adopted usually in the field of ceramics (solid phase method, liquid phase method, gas phase method, atomizing pyrolysis method etc.) can be used for preparation of said raw material powders.

In solid phase method, first of all, each composition including said main raw materials and vice raw materials as the starting materials are weighed and gathered to satisfy the predetermined compositional ratio, and then the materials are mixed and milled in dry or wet process by using of well-known grinding mill such as crusher mill, attriter, ball mill, vibration mill, sand grinding. In this case, organic binder and sintering auxiliaries can be added according to necessity.

Subsequently, powder raw materials can be prepared by the following steps that the milled mixture is pre-sintered at lower temperature than the sintering temperature to form the pre-sintered body having the objective phase, and the resulting pre-sintered body is milled according to necessity to prepare the powder raw materials. For this case, the starting materials are oxides as described above. However, the materials such as hydroxide and carbonate that finally become oxide by pre-sintering can be utilized. In particular, the composition with easiness of particle size control and excellent miscibility is more preferable.

In liquid phase method, the powder raw material can be got by well-known coprecipitation method or hydrothermal synthesis method, wherein the desired composition precipitates from the solution raw material, or the residual solid material is obtained by evaporating the solvent. As the solution raw material, for example, there can be used a solution that the composition comprising chloride, nitrate or organic salt etc. of alkaline earth metal element, rare earth element, aluminum element, titanium element and other element is dissolved into water solvent, or alkoxide of said composition is dissolved into non-water solvent (organic solvent of methanol or ethanol etc.).

The powder raw material synthesized by liquid phase method is excellent in the point that the raw material composition can be formed uniformly with easiness. Additionally, in liquid phase method, film-shaped microwave dielectric compositions integrated with the base material can be produced by coating the solution raw material which contains the specified quantity of alkaline earth metal element, rare earth element, aluminum element, titanium element and other element are dissolved on the base material, and sintering said coating film with the base material.

In gas phase method, for example, CVD (Chemical Vapor Deposition) method or vapor phase dissociation method using liquid raw materials can be applied. Gas phase method is particularly profitable in the case that the thin film shaped microwave dielectric composite composition is directly formed on the base material or the powder raw material of high crystallinity is prepared.

Average particle diameter of the powder raw materials can be changed appropriately depending on the composition of the powder raw material and the shape of end-product. The diameter is normally 0.05 to 10 μm, preferably 0.1 to 8 μm, and more preferably 0.2 to 6 μm.

Next, powder raw materials are mixed and molded to any shape. This forming method is not limited especially, and there can be used the general forming method which is utilized in the field of ceramics or powder metallurgy, for example, pressure forming method with dies, cold isostatic pressing method (CIP), extrusion molding method, doctor blade tape molding method or slip casting method. The forming conditions are adjusted in the molding conditions of each well-known forming method, and it is especially preferable that the conditions are adjusted properly to fill the powder raw materials uniformly well.

Subsequently, the formed material is sintered. The sintering method is not particularly limited, and the well-known sintering methods such as pressureless sintering and pressure sintering can be adopted. Sintering temperature can be changed appropriately depending on the kind of powder raw materials and composition etc. In a typical example, it is preferable that the temperature is arranged in a range of 1000 to 1700° C.

When the sintering temperature is too low, the objective compactness might not be achieved and the predetermined characteristics of the sintered body might not be furnished. Additionally, when the sintering temperature is too high, a change of composition or a change of fine structure due to grain growth are arisen, and then physical property control of sintered body becomes difficult, energy consumption might increase, and there is a case to come down productive efficiency.

Sintering atmosphere is not particularly limited and for example, it can be chosen depending on necessity of reduction treatment. For example, when reduction treatment is necessary simultaneously with sintering, the reduction atmosphere is suitable. In addition, for example, in a case without necessity of reduction treatment, pressureless sintering in air is profitable. Sintering in oxygen atmosphere is effective to control oxygen partial pressure, especially in a case that it is necessary to control the composition and the fine structure of the sintered body. In the present invention, the oxygen partial pressure is not particularly limited in an oxidation atmosphere.

In addition, according to the present invention, powder raw materials synthesized by any method and the body formed there from may be pre-sintered if necessary before sintering. The pre-sintering temperature can be appropriately determined in the temperature region lower than the sintering temperature. The pre-sintering atmosphere can be also determined appropriately in the same manner as the sintering case, too.

The crystal structure of said microwave dielectric composite composition is analyzed by powder X-ray diffraction method. The sintered sample is milled in mortar till the crushed sample particle size becomes less than 20 μm, a glass holder is filled with said crushed powder sample, and the X-ray measurement is performed. Geigerflex RAD-B System made by RIGAKUDENKI company is used for the measurement. The crystal phase is identified on the basis of the measurement results by using ICDD card.

Next, lattice constants of the sample are measured precisely by WPPD method. In this case, X'pert System manufactured by Philips company is used for the data measurement. The WPPD is the abbreviation of Whole-Powder-Pattern Decomposition Method, which can derive the information of diffraction angle, integrated intensity and half-amplitude width all at once from pattern fitting between the whole data of experimental powder diffraction and the theoretical powder diffraction pattern. In this way, the crystal structure of the produced sample is analyzed.

In addition, relative dielectric constant $\in_r$, quality factor $Q \cdot f$ and temperature coefficient $\tau_f$ of the produced microwave dielectric composite composition are measured by Hakki and Coleman method (Both end short-circuit type dielectric resonator method, "Research study report on standardization of performance evaluation of new ceramics material", published by Corporate Judicial Person Japan Fine Ceramics Association, March, 1992.). Additionally, the measurement is done with the measurement frequency of 4 to 5 GHz. The temperature coefficient $\tau_f$ is obtained from the change of resonance frequency in the temperature range of 20 to 80° C.

THE BEST MODE TO CARRY OUT THE INVENTION

Figure 1:
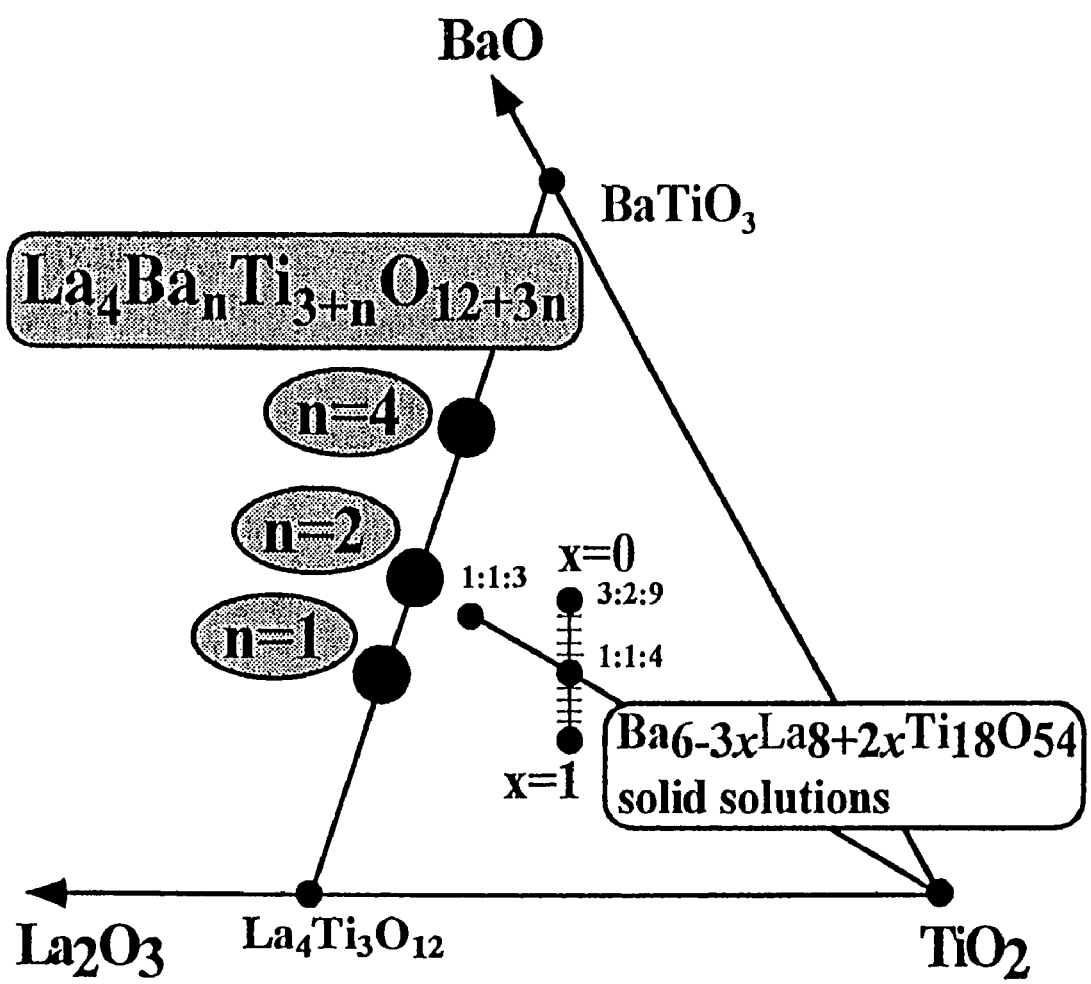
FIG. 1 is a three-component diagram of $BaO \cdot La_2O_3 \cdot TiO_2$.
Figure 2:
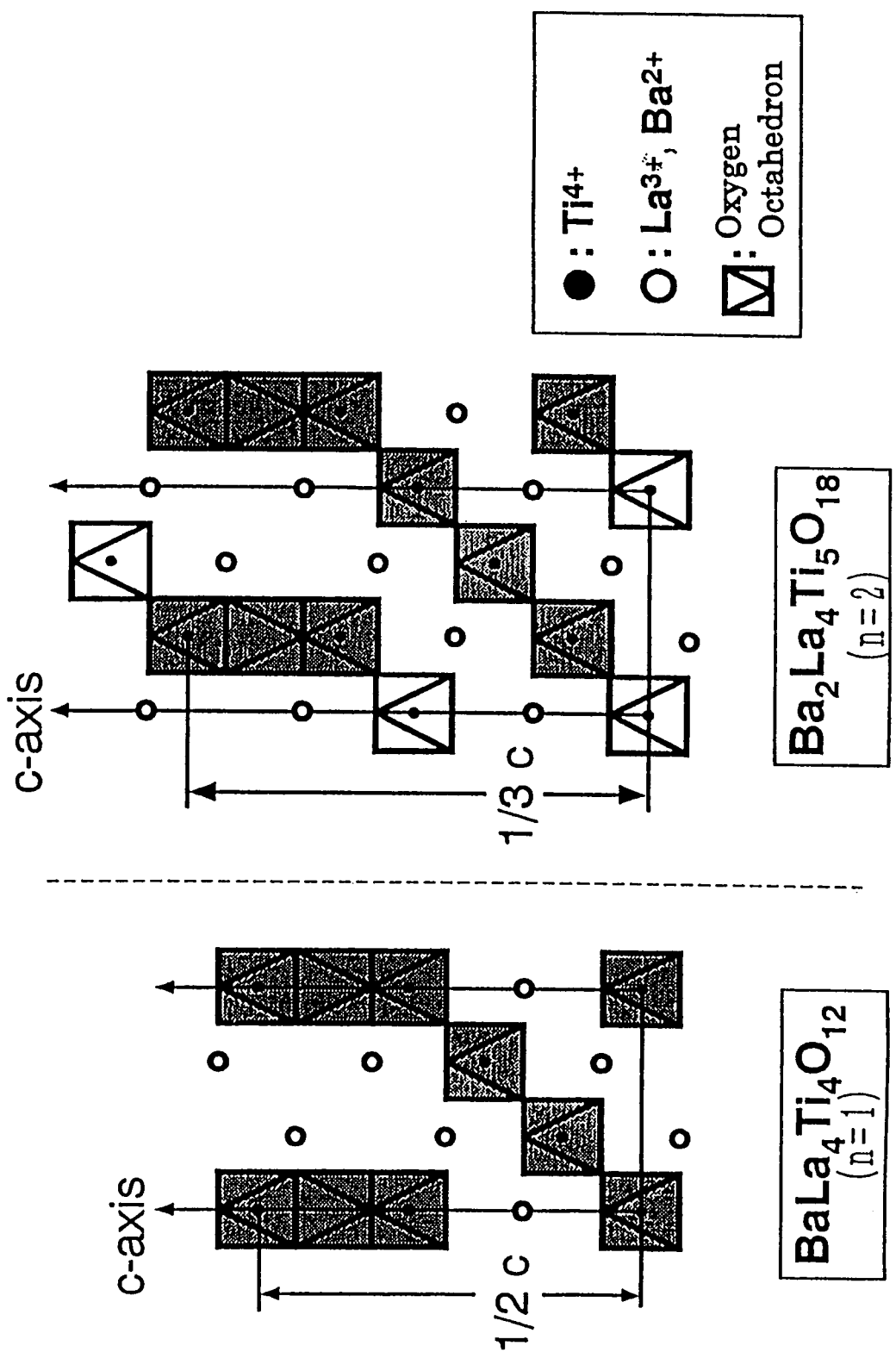
FIG. 2 is a crystal structure diagram of homologous compositions in the cases of n=1,2.

In the following, the specific embodiments of the microwave dielectric composite composition concerning the present invention are explained in details with reference to diagrams and tables.

[Embodiment 1: $(Ba_{1-x}A_x)_n La_4 Ti_{3+n} O_{12+3n}$]

The embodiment 1 corresponds to the microwave dielectric composite composition expressed by the composition formula $(Ba_{1-x}A_x)_n La_4 Ti_{3+n} O_{12+3n}$. Homologous composite composition samples with n=1 are produced, wherein Mg, Ca, Sr are chosen as alkaline earth metal element A. Because, it is considered that among the homologous composite composition, the case of n=1 shows the better microwave dielectric properties than the case of n=2 or 4. In addition, homologous similar composite composition with the condition of A=Sr and n=2.2 is produced.

Three ingredients of $BaCO_3$, $La_2O_3$ and $TiO_2$ as main materials and one of $MgCO_3$, $CaCO_3$ and $SrCO_3$ as auxiliary material are chosen and weighed. Since $La_2O_3$ is easy to be hydrated, it is pre-sintered in Kanthal furnace at 1000° C. for 10 hours. Four kinds of weighed raw material are blended through wet process with ethanol in alumina mortar for 2 hours. The composition is formed from the mixed materials by pre-sintering at 1000° C. for 2 hours.

The pre-sintered material is blended with binder of 1~2 ml of 1~3 wt % PVA (polyvinyl alcohol) aqueous solution in almina mortar. The mixed sample is granulated by using of a screen of 300 μm. The granulated sample (2.35 g) is filled in a die (12 mm φ), and uniaxial pressing is done by pressure of 10 MPa for one minute, so that a cylindrical pellet is made. The pellet is packed in vacuum and pressed by hydrostatic pressure of 100 MPa, which is called CIP (cold temperature hydrostatic pressure application, normally Cold Isostatic Pressing). A sample is formed by the CIP.

After the CIP process, the sample is degreased by Kanthal furnace at 300° C. for 2 hours under atmosphere. Afterwards, said sample is sintered at 1600° C. for 2 hours. The shape of pellet is restricted by Hakki and Coleman method, so that the ratio of diameter d and height h is determined to be d:h=2:1.

The pellet surface is polished to mirror surface to minimize the microwave loss during microwave dielectric measurement. The pellet is coated with electron wax to be bounded on equipment, and polished by using No. 800 SiC abrasive. Finally, the pellet is finished with No. 2000 emery paper.

The polished sample is washed in acetone by ultrasonic cleaning method. At last, the sample is heat-treated at 1000° C. for 2 hours in Kanthal furnace under atmosphere to remove the electron wax for binding and grease. An applicator is used to avoid that the fat or dirt bonds to the sample during the measurement of microwave dielectric properties.

Composition formula of the sample which are made as described above are three types of $(Ba_{1-x}Mg_x)La_4Ti_4O_{15}$, $(Ba_{1-x}Ca_x)La_4Ti_4O_{15}$, $(Ba_{1-x}Sr_x)La_4Ti_4O_{15}$, in the case of n=1, and also one type of $(Ba_{1-x}Sr_x)_nLa_4Ti_{3+n}O_{12+n}$ in the case of n=2.2.

The microwave dielectric properties of said samples are measured. This is to say, relative dielectric constant $\in_r$, quality factor Q·f and temperature coefficient $\tau_f$ are measured for said three kinds of samples. The measuring method is Hakki and Coleman method described above. Value of replacement compositional ratio x is adjusted appropriately. The data are summarized in Table 1-1, Table 1-2 and Table 1-3.

TABLE 1-1

$(Ba_{1-x}Mg_x)La_4Ti_4O_{15}$

| | Compositional Ratio x | Relative Dielectric Constant $e_r$ | Quality Factor Q·f(GHZ) | Temperature Coefficient $\tau_f$(ppm/° C.) |
|---|---|---|---|---|
| (1) | 0.01 | 45.3 | 29030 | −15.1 |
| (2) | 0.05 | 37.5 | 15501 | −4.4 |
| (3) | 0.05 | 45.9 | 30980 | −12.0 |

(1) 10° C./min.–1570° C.,
(2) 10° C./min.–1550° C.,
(3) 5° C./min.–1570° C.:
(1) means that the temperature is raised up at the rate of 10° C. per minute and the sintering temperature is 1570° C., and this description is omitted in the following tables because the conditions in following tables are set in the same manner.

TABLE 1-2

$(Ba_{1-x}Ca_x)La_4Ti_4O_{15}$

| | Compositional Ratio x | Relative Dielectric Constant $e_r$ | Quality Factor Q·f(GHz) | Temperature Coefficient $\tau_f$(ppm/° C.) |
|---|---|---|---|---|
| (1) | 0.01 | 45.9 | 43165 | −12.5 |
| (2) | 0.05 | 44.8 | 45922 | −13.1 |
| (3) | 0.10 | 35.1 | 26176 | |
| (4) | 0.20 | 32.3 | 28678 | |
| (5) | 0.50 | 37.3 | 32917 | |

(1)~(5): 10° C./min.–1550° C.

TABLE 1-3

$(Ba_{1-x}Sr_x)La_4Ti_4O_{15}$

| | Compositional Ratio x | Relative Dielectric Constant $e_r$ | Quality Factor Q·f(GHz) | Temperature Coefficient $\tau_f$(ppm/° C.) |
|---|---|---|---|---|
| (1) | 0.05 | 46.5 | 33052 | −11.9 |
| (2) | 0.10 | 38.4 | 31512 | 41.3 |
| (3) | 0.20 | 41.9 | 37714 | −10.0 |
| (4) | 0.50 | 34.0 | 28995 | −7.4 |

(1)~(4): 10° C./min.–1550° C.

The data that the milling process are done after pre-sintering at 1200° C. are shown in Table 1-4.

TABLE 1-4

$(Ba_{1-x}Sr_x)La_4Ti_4O_{15}$

| | Compositional Ratio x | Relative Dielectric Constant $e_r$ | Quality Factor Q·f(GHz) | Temperature Coefficient $\tau_f$(ppm/° C.) |
|---|---|---|---|---|
| (1) | 0.10 | 45.1 | 42548 | −15.0 |
| (2) | 0.20 | 46.5 | 41584 | |
| (3) | 0.50 | 46.4 | 47163 | −12.5 |

(1)~(3): 10° C./min.–1550° C.

The data of the homologous composite composition with n=2.2 are shown in Table 1-5.

TABLE 1-5

$(Ba_{1-x}Sr_x)_nLa_4Ti_{3+n}O_{12+3n}$, n = 2.2

| | Compositional Ratio x | Relative Dielectric Constant $e_r$ | Quality Factor Q·f(GHz) | Temperature Coefficient $\tau_f$(ppm/° C.) |
|---|---|---|---|---|
| (1) | 0.10 | 43.6 | 31387 | 26.8 |

(1): 10° C./min.–1550° C.

So far as judging from Table 1-1 to Table 1-5, it is found that the homologous composite composition and homologous similar composite composition which is replaced a part of Ba with other alkaline earth metal element have the same excellent microwave dielectric properties as the pure homologous composition of Ba. If such a microwave dielectric properties are provided, they can be used sufficiently as dielectric resonator.

[Embodiment 2: $Ba_n(La_{1-y}R_y)_4Ti_{3+n}O_{12+3n}$]

The embodiment 2 corresponds to the microwave dielectric composite composition expressed by the composition formula $Ba_n(La_{1-y}R_y)_4Ti_{3+n}O_{12+3n}$. The sample of homologous composite composition with n=1 is produced, wherein R is Al or rare earth element except La. In addition, the sample of homologous composite composition of R=Al with n=2.2 is produced.

As raw materials, $BaCO_3$, $La_2O_3$, $R_2O_3$ and $TiO_2$ are chosen and weighed. Afterwards, in the same manner as the embodiment 1, the objective $Ba_n(La_{1-y}R_y)_4Ti_{3+n}O_{12+3n}$ is produced through the process of component adjusting→wet blending→pre-sintering→granulation→forming→sintering→polishing.

In this way, the samples of homologous composite composition of the cases of R=Al, Y, Sm, Nd, Gd are produced, and also the sample of the homologous similar composite composition of R=Al with n=2.2 is produced. The relative dielectric constant $\in_r$, the quality factor Q·f and the temperature coefficient $\tau_f$ are measured for the six kinds of sample by Hakki and Coleman method. The data are summarized in Table 2-1 to Table 2-6.

TABLE 2-1

$Ba(La_{1-y}Al_y)_4Ti_4O_{15}$

| | Compositional Ratio x | Relative Dielectric Constant $\in_r$ | Quality Factor Q · f(GHz) | Temperature Coefficient $\tau_f$(ppm/° C.) |
|---|---|---|---|---|
| (1) | 0.01 | 44.1 | 46997 | 1.3 |
| (2) | 0.05 | 44.9 | 22150 | -20.1 |
| (3) | 0.20 | 35.1 | 11497 | 2.1 |

(1)~(3): 10° C./min.–1550° C.

It is found that $\tau_f$ becomes small to almost zero in x=0.01 and 0.20.

TABLE 2-2

$Ba(La_{1-y}Y_y)_4Ti_4O_{15}$

| | Compositional Ratio x | Relative Dielectric Constant $\in_r$ | Quality Factor Q · f(GHz) | Temperature Coefficient $\tau_f$(ppm/° C.) |
|---|---|---|---|---|
| (1) | 0.01 | 45.4 | 37914 | -5.9 |
| (2) | 0.05 | 46.4 | 32665 | -4.0 |
| (3) | 0.10 | 49.1 | 4385 | |
| (4) | 0.05 | 49.1 | 9230 | |

(1)~(3): 10° C./min.–1550° C., (4): 10° C./min.–1570° C.

TABLE 2-3

$Ba(La_{1-y}Sm_y)_4Ti_4O_{15}$

| | Compositional Ratio x | Relative Dielectric Constant $\in_r$ | Quality Factor Q · f(GHz) | Temperature Coefficient $\tau_f$(ppm/° C.) |
|---|---|---|---|---|
| (1) | 0.05 | 46.8 | 34459 | -8.1 |
| (2) | 0.10 | 47.5 | 28982 | -5.8 |

(1)~(2): 10° C./min.–1570° C.

TABLE 2-4

$Ba(La_{1-y}Nd_y)_4Ti_4O_{15}$

| | Compositional Ratio x | Relative Dielectric Constant $\in_r$ | Quality Factor Q · f(GHz) | Temperature Coefficient $\tau_f$(ppm/° C.) |
|---|---|---|---|---|
| (1) | 0.05 | 43.0 | 31900 | -27.7 |
| (2) | 0.10 | 42.9 | 30400 | -25.0 |
| (3) | 0.50 | 34.3 | 17873 | -104.3 |

(1)~(3): 10° C./min.–1550° C.

TABLE 2-5

$Ba(La_{1-y}Gd_y)_4Ti_4O_{15}$

| | Compositional Ratio x | Relative Dielectric Constant $\in_r$ | Quality Factor Q · f(GHz) | Temperature Coefficient $\tau_f$(ppm/° C.) |
|---|---|---|---|---|
| (1) | 0.01 | 45.9 | 33257 | -12.9 |
| (2) | 0.05 | 47.1 | 9402 | -7.5 |

(1)~(2): 10° C./min.–1550° C.

The data of the homologous similar composite composition with n=2.2 are shown in Table 2-6.

TABLE 2-6

$Ba_n(La_{1-y}Al_y)_4Ti_{3+n}O_{12+3n}$, n = 2.2

| | Compositional Ratio x | Relative Dielectric Constant $\in_r$ | Quality Factor Q · f(GHz) | Temperature Coefficient $\tau_f$(ppm/° C.) |
|---|---|---|---|---|
| (1) | 0.01 | 43.7 | 26363 | 48.1 |

(1): 10° C./min.–1550° C.

As far as judging from Table 2-1 to Table 2-6, it is found that the homologous composite composition and homologous similar composite composition replaced a part of La with Al or other rare earth element have the same excellent microwave dielectric properties as the homologous composition of La. If such microwave dielectric properties are provided, they can be used enough as dielectric resonator.

[Embodiment 3: $Ba_nLa_4(Ti_{1-z}M_z)_{3+n}O_{12+3n}$]

The embodiment 3 corresponds to the microwave dielectric composite composition expressed by the composition formula $Ba_nLa_4(Ti_{1-z}M_z)_{3+n}O_{12+3n}$, where M is the additional elements which is not Ti. The sample of a homologous composite composition with n=1 is produced. In addition, the sample of homologous similar composite composition with the conditions of M=Zr and n=2.2 is produced.

As raw materials, $BaCO_3$, $La_2O_3$, $TiO_2$ and $MO_2$ are chosen and weighed. It is preferable that the valence number of M is +4, because Ti is replaced with M. Afterwards, in the same manner as the embodiment 1, the objective $Ba_nLa_4(Ti_{1-z}M_z)_{3+n}O_{12+3n}$ is produced through the process of component adjusting→wet blending→pre-sintering→granulation→forming→sintering→polishing.

In this way, the samples of the homologous composite composition of Zr, Si, Sn as M are produced, and the sample of the homologous similar composite composition of M=Zr with n=2.2 is produced. The relative dielectric constant $\in_r$, the quality factor Q·f, and the temperature coefficient $\tau_f$ are measured for these four kinds of sample by Hakki and Coleman method. The data are listed in Table 3-1 to Table 3-4.

TABLE 3-1

$BaLa_4(Ti_{1-z}Zr_z)_4O_{15}$

| | Compositional Ratio x | Relative Dielectric Constant $\in_r$ | Quality Factor Q · f(GHz) | Temperature Coefficient $\tau_f$(ppm/° C.) |
|---|---|---|---|---|
| (1) | 0.01 | 45.1 | 40955 | -11.5 |
| (2) | 0.05 | 44.0 | 27037 | -0.8 |
| (3) | 0.10 | 34.3 | 4040 | 95.9 |

(1)~(3): 10° C./min.–1550° C.

TABLE 3-2

$BaLa_4(Ti_{1-z}Si_z)_4O_{15}$

| | Composition Ratio x | Relative Dielectric Constant $e_r$ | Quality Factor $Q \cdot f(GHz)$ | Temperature Coefficient $\tau_f(ppm/°C.)$ |
|---|---|---|---|---|
| (1) | 0.01 | 45.3 | 34919 | −4.3 |
| (2) | 0.01 | 45.8 | 32376 | |
| (3) | 0.05 | 41.8 | 7562 | 31.7 |
| (4) | 0.01 | 46.1 | 35498 | −3.9 |
| (5) | 0.01 | 48.1 | 13530 | 9.4 |
| (6) | 0.05 | 43.7 | 7929 | |

(1)~(3): 10° C./min.–1500° C.,
(4): 10° C./min.–1520° C.,
(5)~(6): 10° C./min.–1550° C.

TABLE 3-3

$BaLa_4(Ti_{1-z}Sn_z)_4O_{15}$

| | Compositional Ratio x | Relative Dielectric Constant $e_r$ | Quality Factor $Q \cdot f(GHz)$ | Temperature Coefficient $\tau_f(ppm/°C.)$ |
|---|---|---|---|---|
| (1) | 0.01 | 46.4 | 41391 | −8.9 |
| (2) | 0.05 | 44.2 | 41415 | −13.8 |

(1)~(2): 10° C./min.–1550° C.

The data of the homologous similar composite composition with n=2.2 are shown in Table 3-4.

TABLE 3-4

$BaLa_4(Ti_{1-z}Zr_z)_{3+n}O_{12+3n}, n = 2.2$

| | Compositional Ratio x | Relative Dielectric Constant $e_r$ | Quality Factor $Q \cdot f(GHz)$ | Temperature Coefficient $\tau_f(ppm/°C.)$ |
|---|---|---|---|---|
| (1) | 0.05 | 43.6 | 31387 | 35.5 |

(1): 10° C./min.–1550° C.

As far as judging from Table 3-1 to Table 3-4, it is found that the homologous composite composition and homologous similar composite composition replaced a part of Ti with other element have the same excellent microwave dielectric properties as the homologous composition of Ti. If such microwave dielectric properties are provided, they can be used enough as dielectric resonator.

[Embodiment 4: $(Ba_{1-x}A_x)_n(La_{1-y}R_y)_4Ti_{3+n}O_{12+3n}$]

It is studied about the homologous similar composite composition and the homologous composite composition, wherein a part of Ba is replaced with alkaline earth metal element A different from Ba and a part of La is also replaced with Al or rare earth element different from La.

Estimating from the embodiment 1 and the embodiment 2, it can be considered that the microwave dielectric properties become good in the specific range of x and y, when a part of Ba and La are replaced simultaneously. Since the combination of dual system becomes complicated, at first, the sample of which the conditions are A=Ca, R=Al, x=0.05, and y=0.01 with n=2.0 is produced and the microwave dielectric properties of the sample are measured briefly. The measured data shows good result.

Subsequently, it is decided that the replacement element is changed and then the microwave dielectric properties are measured precisely. Sr is chosen as the part replacement element of Ba, Al is chosen as the part replacement element of La, and x=0.1 is set with y=0.01. Under these conditions, the samples of n=1.0 and n=2.2 are produced, and the microwave dielectric properties are shown in Table 4.

TABLE 4

$(Ba_{1-x}Sr_x)_n(La_{1-y}Al_y)_4Ti_{3+n}O_{12+3n}$

| | Compositional Ratio n | Relative Dielectric Constant $e_r$ | Quality Factor $Q \cdot f(GHz)$ | Temperature Coefficient $\tau_f(ppm/°C.)$ |
|---|---|---|---|---|
| (1) | 1.0 | 44.8 | 47515 | −3.5 |
| (2) | 2.2 | 40.7 | 29903 | 37.5 |

(1)~(2): 10° C./min.–1550° C.

As seen in Table 4, it is confirmed that these samples hold the performance that can be applied to microwave resonator. Therefore, it is found that the homologous composite composition of $(Ba_{1-x}A_x)_n(La_{1-y}R_y)_4Ti_{3+n}O_{12+3n}$ can be used as the microwave dielectric composite composition.

[Embodiment 5: $(Ba_{1-x}A_x)_nLa_4(Ti_{1-z}M_z)_{3+n}O_{12+3n}$]

It is studied about the homologous similar composite composition and the homologous composite composition, wherein a part of Ba is replaced with alkaline earth metal element A different from Ba and a part of Ti is also replaced with other element M different from Ti.

Estimating from the embodiment 1 and the embodiment 3, it can be considered that the microwave dielectric properties become good in the specific range of x and z, when a parts of Ba and Ti are replaced simultaneously. Since the combination of dual system is complicated, at first, the sample of A=Sr, M=Si, x=0.05, and z=0.05 with n=2.0 is produced and the microwave dielectric properties of the sample are measured briefly. The measured data shows good result.

Therefore, it is decided that the replacement elements are changed and then the microwave dielectric properties are measured precisely. Sr is chosen as the part replacement element of Ba. Zr is chosen as the part replacement element of Ti, and x=0.1 is set with y=0.05. Under the conditions, samples of n=1.0 and n=2.2 are produced, and the microwave dielectric properties are shown in Table 5.

TABLE 5

$(Ba_{1-x}Sr_x)_nLa_4(Ti_{1-z}Zr_z)_{3+n}O_{12+3n}$

| | Compositional Ratio n | Relative Dielectric Constant $e_r$ | Quality Factor $Q \cdot f(GHz)$ | Temperature Coefficient $\tau_f(ppm/°C.)$ |
|---|---|---|---|---|
| (1) | 1.0 | 48.7 | 32612 | −7.4 |
| (2) | 2.2 | 61.7 | 2367 | 21.7 |

(1)~(2): 10° C./min.–1550° C.

As seen in Table 5, it is confirmed that these samples hold the performance that can be applied to microwave resonator. In addition, even though it can be seen that the quality factor becomes small in n=2.2, it can be applicable by restricting the range of usage. Therefore, it is confirmed that the homologous composite composition of $(Ba_{1-x}A_x)_nLa_4(Ti_{1-z}M_z)_{3+n}O_{12+3n}$ can be used as microwave dielectric composite composition.

[Embodiment 6: $Ba_n(La_{1-y}R_y)_4(Ti_{1-z}M_z)_{3+n}O_{12+3n}$]

It is studied about the homologous similar composite composition and the homologous composite composition wherein a part of La is replaced with Al or rare earth element A different from La, and a part of Ti is also replaced with other additional element M different from Ti.

Estimating from the embodiment 2 and the embodiment 3, it can be considered that the microwave dielectric properties become good in the specific range of y and z, when a parts of La and Ti are replaced simultaneously. Since the combination of dual system is complicate, at first, the sample of R=Al, M=Si, y=0.01 and z=0.05 with n=2.0 is produced and the microwave dielectric properties of the sample are measured briefly. The measured data show good result.

Accordingly, it is decided that the replacement elements are changed and the microwave dielectric properties are measured precisely. Al is chosen as the part replacement element of La, and Zr is chosen as the part replacement element of Ti, and y=0.01 is set with z=0.05. Under these conditions, samples of n=1.0 and n=2.2 are produced, and the microwave dielectric properties are shown in Table 6.

TABLE 6

$Ba_n(La_{1-y}Al_y)_4(Ti_{1-z}Zr_z)_{3+n}O_{12+3n}$

| | Compositional Ratio n | Relative Dielectric Constant $e_r$ | Quality Factor Q · f(GHz) | Temperature Coefficient $\tau_f$(ppm/° C.) |
|---|---|---|---|---|
| (1) | 1.0 | 48.5 | 37356 | 2.9 |
| (2) | 2.2 | 47.8 | 16485 | 42.0 |

(1)~(2): 10° C./min.–1550° C.

As seen in Table 6, it is confirmed that these samples hold the performance that can be applied to microwave resonator. Therefore, the homologous composite composition of $Ba_n(La_{1-y}R_y)_4(Ti_{1-z}M_z)_{3+n}O_{12+3n}$ can be used as microwave dielectric composite composition.

[Embodiment 7: $(Ba_{1-x}A_x)_n(La_{1-y}R_y)_4(Ti_{1-z}M_z)_{3+n}O_{12+3n}$]

It is studied about the homologous similar composite composition and the homologous composite composition, wherein a part of Ba is replaced with alkaline earth metal element A different from Ba, a part of La is replaced with rare earth element R different from La, or Al and a part of Ti is also replaced with other additional element M different from Ti.

Estimating from the embodiments 1, 2 and 3, it can be considered that the microwave dielectric properties become good in the specific range of x, y, and z, when a parts of Ba, La and Ti are replaced simultaneously. Since the combination of ternary system is too complicated, at first, the sample of A=Ca, R=Al, M=Si, x=0.05, y=0.01, and z=0.05 with n=2.0 is produced, and the microwave dielectric properties are measured for the sample briefly. The measured data show the acceptable result.

Therefore, it is decided that the replacement elements are changed and the microwave dielectric properties are measured precisely. Sr is chosen as the part replacement element of Ba, Al is chosen as the part replacement element of La, and Zr is chosen as the part replacement element of Ti, and x=0.1, y=0.01 and z=0.05 are set. Under these conditions, the samples of n=1.0 and n=2.2 are produced, and the microwave dielectric properties are shown in Table 7.

TABLE 7

$(Ba_{1-x}Sr_x)_n(La_{1-y}Al_y)_4(Ti_{1-z}Zr_z)_{3+n}O_{12+3n}$

| | Compositional Ratio n | Relative Dielectric Constant $e_r$ | Quality Factor Q · f(GHz) | Temperature Coefficient $\tau_f$(ppm/° C.) |
|---|---|---|---|---|
| (1) | 1.0 | 37.1 | 36988 | −4.4 |
| (2) | 2.2 | 39.1 | 16307 | 36.1 |

(1)~(2): 10° C./min.–1550° C.

As seen in Table 7, it is confirmed that these samples hold the performance that can be applied to microwave resonator. Therefore, the homologous composite composition of $(Ba_{1-x}A_x)_n(La_{1-y}R_y)_4(Ti_{1-z}M_z)_{3+n}O_{12+3n}$ can be used as microwave dielectric composite composition.

In the present invention, there might exist various kinds of unavoidable impurity that does not deteriorate the characteristics remarkably. In addition, various kinds of oxide can be added or composition shift can be allowed, so far as they do not give bad influence to the dielectric properties. Furthermore, there is a case that low temperature sintering gives similar effects, and basically, this case is also included in technical scope of the present invention.

As described, needless to say, the present invention is not limited to the embodiments described above, and various modifications and design alterations which deviate from the technical spirit of the present invention are included in the technical scope of the invention.

INDUSTRIAL APPLICABILITY

According to the first invention, the microwave dielectric composite composition expressed by $(Ba_{1-x}A_x)_nLa_4Ti_{3+n}O_{12+3n}$ shows the excellent microwave dielectric properties, and it is widely applicable to dielectric resonator for cellular phone and mobile radio communication, and also can contribute to enrichment and diversification of resonator materials. In particular, the excellent microwave dielectric properties can be appeared not only for the homologous structure with n=1,2,4 but also for the homologous similar structure with 0.5<n<5 (excluding n=1,2,4).

According to the second invention, the microwave dielectric composite composition expressed by $Ba_n(La_{1-y}R_y)_4Ti_{3+n}O_{12+3n}$ shows the excellent microwave dielectric properties, the microwave dielectric properties can be adjusted by changing replacement quantity of R, and it can contribute to enrichment and diversification of resonator materials. In particular, the excellent microwave dielectric properties can be appeared not only for the homologous structure with n=1,2,4 but also for the homologous similar structure with 0.5<n<5 (excluding n=1,2,4).

According to the third invention, the microwave dielectric composite composition expressed by $Ba_nLa_4(Ti_{1-z}M_z)_{3+n}O_{12+3n}$ shows the excellent microwave dielectric properties, the microwave dielectric properties can be adjusted by changing replacement quantity of M, and it can contribute to enrichment and diversification of resonator materials. In particular, the excellent microwave dielectric properties can be appeared not only for the homologous structure with n=1,2,4 but also for the homologous similar structure with 0.5<n<5 (excluding n=1,2,4).

According to the fourth invention, the microwave dielectric composite composition expressed by $(Ba_{1-x}A_x)_n(La_{1-y}R_y)_4Ti_{3+n}O_{12+3n}$ shows the excellent microwave dielectric properties, the microwave dielectric properties can be adjusted by varying replacement quantity of A and R in two dimensions, and it can contribute still more to enrichment and diversification of resonator materials. In particular, the excellent microwave dielectric properties can be appeared not only for the homologous structure with n=1,2,4 but also for the homologous similar structure with 0.5<n<5 (excluding n=1,2,4).

According to the fifth invention, the microwave dielectric composite composition expressed by $(Ba_{1-x}A_x)_nLa_4(Ti_{1-z}M_z)_{3+n}O_{12+3n}$ shows the excellent microwave dielectric properties, the microwave dielectric properties can be adjusted by varying replacement quantity of A and M in two dimensions, and it can contribute still more to enrichment and diversification of resonator materials. In particular, the excellent microwave dielectric properties can be appeared not only for the homologous structure with n=1,2,4 but also for the homologous similar structure with 0.5<n<5 (excluding n=1,2,4).

According to the sixth invention, the microwave dielectric composite composition expressed by $Ba_n(La_{1-y}R_y)_4(Ti_{1-z}M_z)_{3+n}O_{12+3n}$ shows the excellent microwave dielectric properties, the microwave dielectric properties can be adjusted by varying replacement quantity of R and M in two dimensions, and it can contribute still more to enrichment and diversification of resonator materials. In particular, the excellent microwave dielectric properties can be appeared not only for the homologous structure with n=1,2,4 but also for the homologous similar structure with 0.5<n<5 (excluding n=1,2,4).

According to the seventh invention, the microwave dielectric composite composition expressed by $(Ba_{1-x}A_x)_n(La_{1-y}R_y)_4(Ti_{1-z}M_z)_{3+n}O_{12+3n}$ shows the excellent microwave dielectric properties, the microwave dielectric properties can be adjusted by varying replacement quantity of A, R, and M in three dimensions, it can contribute to enrichment and diversification of resonator materials, and also can be contribute to a development of cellular phone and mobile radio communication. In particular, the excellent microwave dielectric properties can be appeared not only for the homologous structure with n=1,2,4 but also for the homologous similar structure with 0.5<n<5 (excluding n=1,2,4).

The invention claimed is:

1. A microwave dielectric composite composition characterized in that said microwave composite dielectric composition is a ceramic composition represented by $(Ba_{1-x}A_x)_nLa_4Ti_{3+n}O_{12+3n}$, wherein A is an alkaline earth metal element except for Ba, n satisfies a range of 0.5<n<5 and x satisfies a range of 0<x<0.5.

2. A microwave dielectric composite composition characterized in that said microwave dielectric composite composition is a ceramic composition represented by $Ba_n(La_{1-y}R_y)_4Ti_{3+n}O_{12+3n}$, wherein R is a rare earth element except for La or a trivalent cation, n satisfies a range of 0.5<n<5 and x satisfies a range of 0<y<0.5.

3. A microwave dielectric composite composition characterized in that said microwave dielectric composite composition is a ceramic composition represented by $Ba_nLa_4(Ti_{1-z}M_z)_{3+n}O_{12+3n}$, wherein M is an additional element selected from the group consisting of Zr, Si and Sn, n satisfies a range of 0.5<n<5 and z satisfies a range of 0<z<0.5.

4. A microwave dielectric composite composition characterized in that said microwave dielectric composite composition is a ceramic composition represented by $(Ba_{1-x}A_x)_n(La_{1-y}R_y)_4Ti_{3+n}O_{12+3n}$, wherein A is an alkaline earth metal element except for Ba, R is a rare earth element except for La or a trivalent cation, n satisfies a range of 0.5<n<5, x satisfies a range of 0<x<0.5 and y satisfies a range of 0<y<0.5.

5. A microwave dielectric composite composition characterized in that said microwave dielectric composite composition is a ceramic composition represented by $(Ba_{1-x}A_x)_nLa_4(Ti_{1-z}M_z)_{3+n}O_{12+3n}$, wherein A is Sr, M is an additional element selected from the group consisting of Zr and Si, n satisfies a range of 0.5<n<5, x satisfies a range of 0<x<0.5 and z satisfies a range of 0<z<0.5.

6. A microwave dielectric composite composition characterized in that said microwave dielectric composite composition is a ceramic composition represented by $Ba_n(La_{1-y}R_y)_4(Ti_{1-z}M_z)_{3+n}O_{12+3n}$, wherein R is a rare earth element except for La or a trivalent cation, M is an additional element except for Ti, n satisfies a range of 0.5<n<5, y satisfies a range of 0<y<0.5 and z satisfies a range of 0<z<0.5.

7. A microwave dielectric composite composition characterized in that said microwave dielectric composite composition is a ceramic composition represented by $(Ba_{1-x}A_x)_n(La_{1-y}R_y)_4(Ti_{1-z}M_z)_{3+n}O_{12+3n}$, wherein A is an alkaline earth metal element except for Ba, R is a rare earth element except for La or a trivalent cation, M is an additional element except for Ti, n satisfies a range of 0.5<n<5, x satisfies a range of 0<x<0.5, y satisfies a range of 0<y<0.5 and z satisfies a range of 0<z<0.5.

* * * * *